United States Patent
Liu et al.

(10) Patent No.: US 6,562,706 B1
(45) Date of Patent: May 13, 2003

(54) STRUCTURE AND MANUFACTURING METHOD OF SiC DUAL METAL TRENCH SCHOTTKY DIODE

(75) Inventors: Chung-Min Liu, Kaohsiung (TW); Chih-Wei Hsu, Hsinchu (TW); Ming-Jer Kao, Tainan (TW); Jeng-Hua Wei, Taipei (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/998,309

(22) Filed: Dec. 3, 2001

(51) Int. Cl.$^7$ ................................................ H01L 21/28

(52) U.S. Cl. ........................................ 438/570; 257/471

(58) Field of Search .................................. 438/570, 571, 438/92, 572, 576; 257/471, 473, 475

(56) References Cited

U.S. PATENT DOCUMENTS

| | | | | |
|---|---|---|---|---|
| 5,040,034 A | * | 8/1991 | Murakami et al. | 357/23.4 |
| 5,612,232 A | * | 3/1997 | Thero et al. | 437/39 |
| 6,184,563 B1 | * | 2/2001 | Yu | 257/471 |
| 6,404,033 B1 | * | 6/2002 | Chang et al. | 257/484 |

* cited by examiner

Primary Examiner—David Nelms
Assistant Examiner—Quoc Hoang
(74) Attorney, Agent, or Firm—Birch, Stewart, Kolasch & Birch, LLP

(57) ABSTRACT

A structure and manufacturing method of an SiC dual metal trench diode. P-type impurity is doped into the bottom of the trench layer of the dual metal trench Schottky diode to eliminate leakage current or avalanche breakdown in the corner of the trench layer in order to increase the concentration of the epitaxial layer. N-type impurity can also be doped into the region between the Schottky contact metal and the epitaxial layer to adjust the Schottky barrier and thus reduce forward voltage required for current to flow through.

12 Claims, 6 Drawing Sheets

STRUCTURE AND MANUFACTURING METHOD OF SIC DUAL METAL TRENCH SCHOTTKY DIODE

BACKGROUND OF THE INVENTION

1. Field of the Invention

The invention relates to structure and manufacturing method of an SiC (Silicon Carbide) dual metal trench Schottky diode, which is applied to a Schottky diode.

2. Related Art

Regular rectifier diodes are easily switched on/off for both forward voltage and reverse voltage at low frequency operation, but the reverse voltage is not cut off at high frequency operation and finally ends up with poor rectification. The Schottky diode is usually used to solve this problem.

Referring to FIG. 1, which illustrates a cross sectional view of a conventional Schottky diode.

A conventional Schottky diodes includes ohmic contact metal 10, substrate 20, an epitaxial layer 30, and Schottky contact metal 40.

The Schottky contact metal is made of gold, silver, platinum, nickel, titanium or other metals, and the epitaxial layer is silicon material doped with impurity (normally from an N-type material). A Schottky junction is formed between the two components.

Before forward bias is applied to the Schottky diode, the energy level of free electrons in the epitaxial layer is lower than the energy level of free electrons in the Schottky contact metal. The energy difference between the two levels is called a Schottky barrier.

After forward bias is applied to the Schottky diode, the free electrons in the epitaxial layer gain enough energy so they jump over the junction and enter the Schottky contact metal and thus generate bias current. Because there is no minority carrier in the metal, thus there is no charge storage and almost no reverse recovery time.

The SiC (Silicon Carbide) Schottky diode that features the Schottky barrier and SiC material containing a high energy band gap is used to produce a high rectifier with advantages such as high voltage, high speed, and low forward voltage.

Referring to FIG. 2, which illustrates a cross sectional view of the conventional dual metal trench Schottly diode.

The dual metal trench (DMT) structure also reduces impedance and thus improves the property of the Schottky diode.

The conventional DMT Schottky diode includes ohmic contact metal 10, substrate 20, an epitaxial layer 30, Schottky contact metal 40 and a trench layer 50.

The expitxial layer 30 is etched to form opening, metal material that is different from the Schottky contact metal and is filled into the opening to form the trench layer 50.

One feature of the DMT Schottky diode is that it takes advantage of the pinch-off phenomenon occurring in the depletion area between two neighboring trench layers 50 to eliminate leakage current generated by reverse voltage.

Because of the curved equipotential line occurring in the bottom corner of the trench layer 50, a magnified electric field caused by point discharge is found in the corner. The magnified electric field reduces the Schottky barrier and then increases the leakage current. Furthermore, avalanche breakdown is also very possible in the corner.

SUMMARY OF THE INVENTION

In order to solve those conventional problems, the invention provides a structure and manufacturing method of an SiC dual metal trench Schottky diode to eliminate leakage current and increase the concentration of the epitaxial layer.

In the invention, P-type impurity is doped into the bottom of the trench layer of the dual metal trench Schottky diode to eliminate leakage current or avalanche breakdown in the corner of the trench layer in order to increase concentration of the epitaxial layer. N-type impurity can also be doped into the region between the Schottky contact metal and the epitaxial layer to adjust the Schottky barrier and thus reduce forward voltage required for current to flow through.

The SiC dual metal trench Schottky diode of the invention includes ohmic contact metal, substrate, an epitaxial layer, Schottky contact metal, a trench layer and implant. The implant formed by P-type impurity is located at the bottom of the trench layer, between the epitaxial layer and the trench layer.

The manufacturing method of the SiC dual metal trench Schottky diode of the invention includes the following steps: providing an ohmic contact metal, forming a substrate, forming an epitaxial layer, forming a Schottky contact metal, etching, forming an implant, forming a trench layer.

The object of the invention is to separate the switch controlling forward and reverse voltage in order to obtain better rectifier diode performance.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
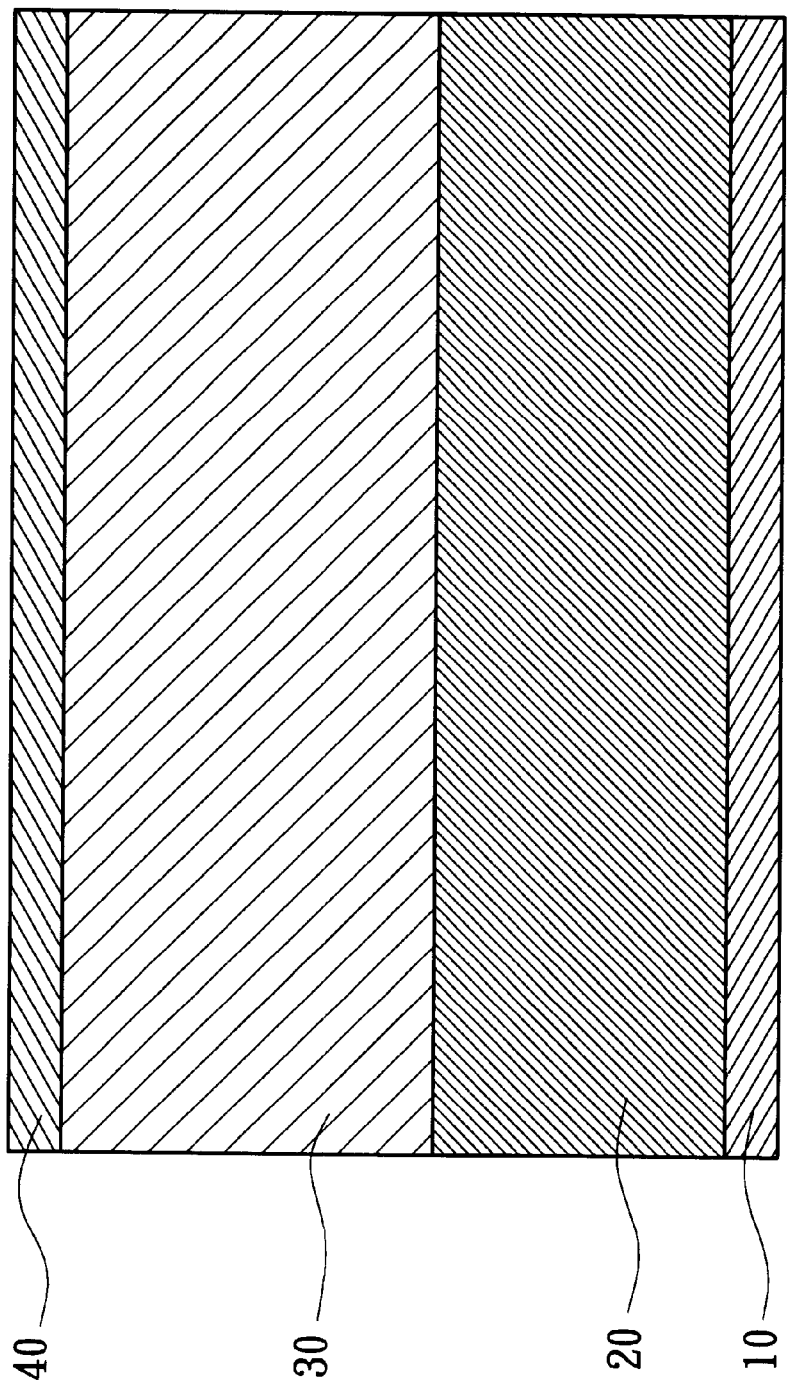
FIG. 1 illustrates a cross sectional view of a conventional Schottky diode.
Figure 2:
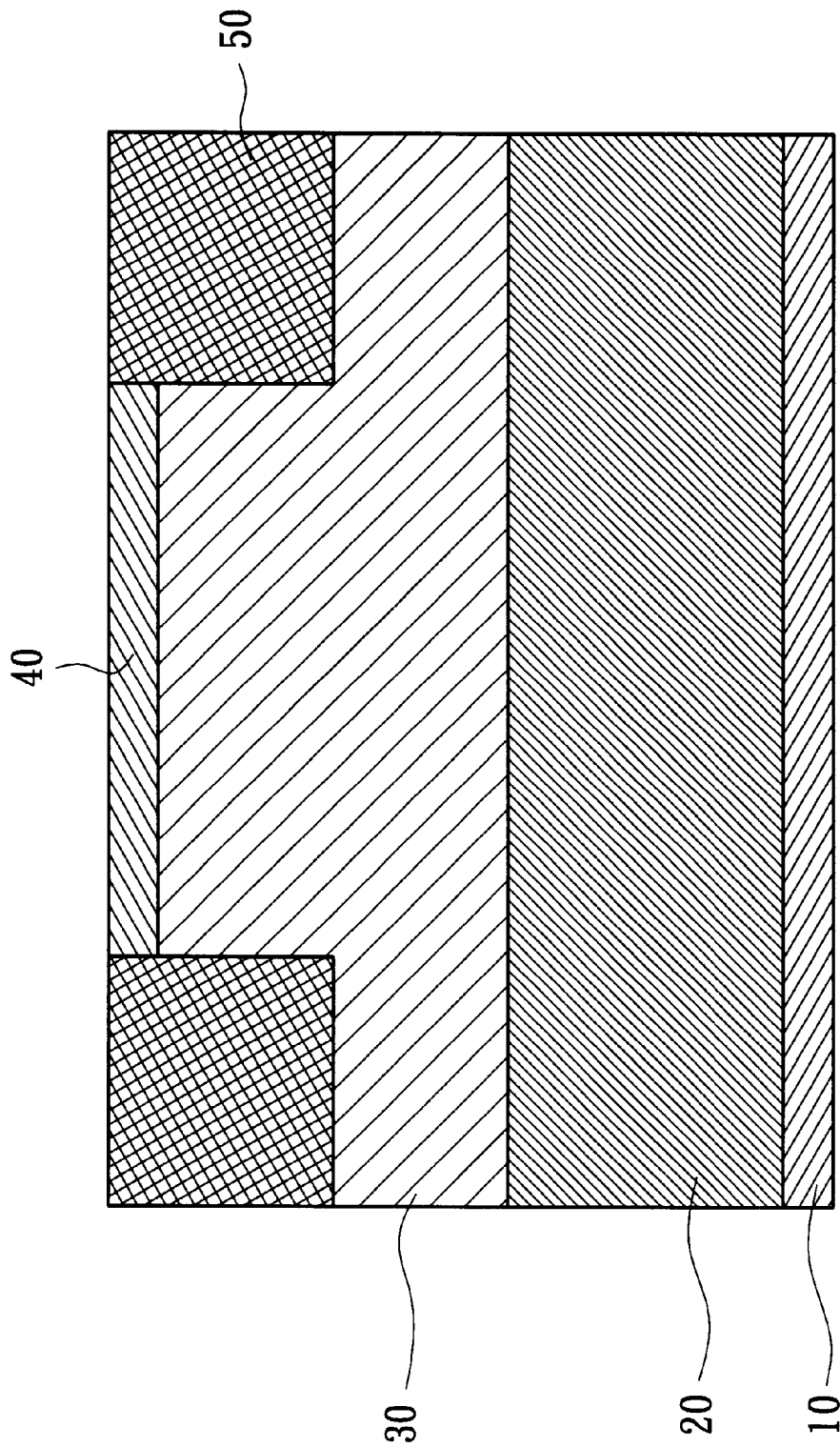
FIG. 2 illustrates a cross sectional view of the conventional dual metal trench Schottly diode.
Figure 3:
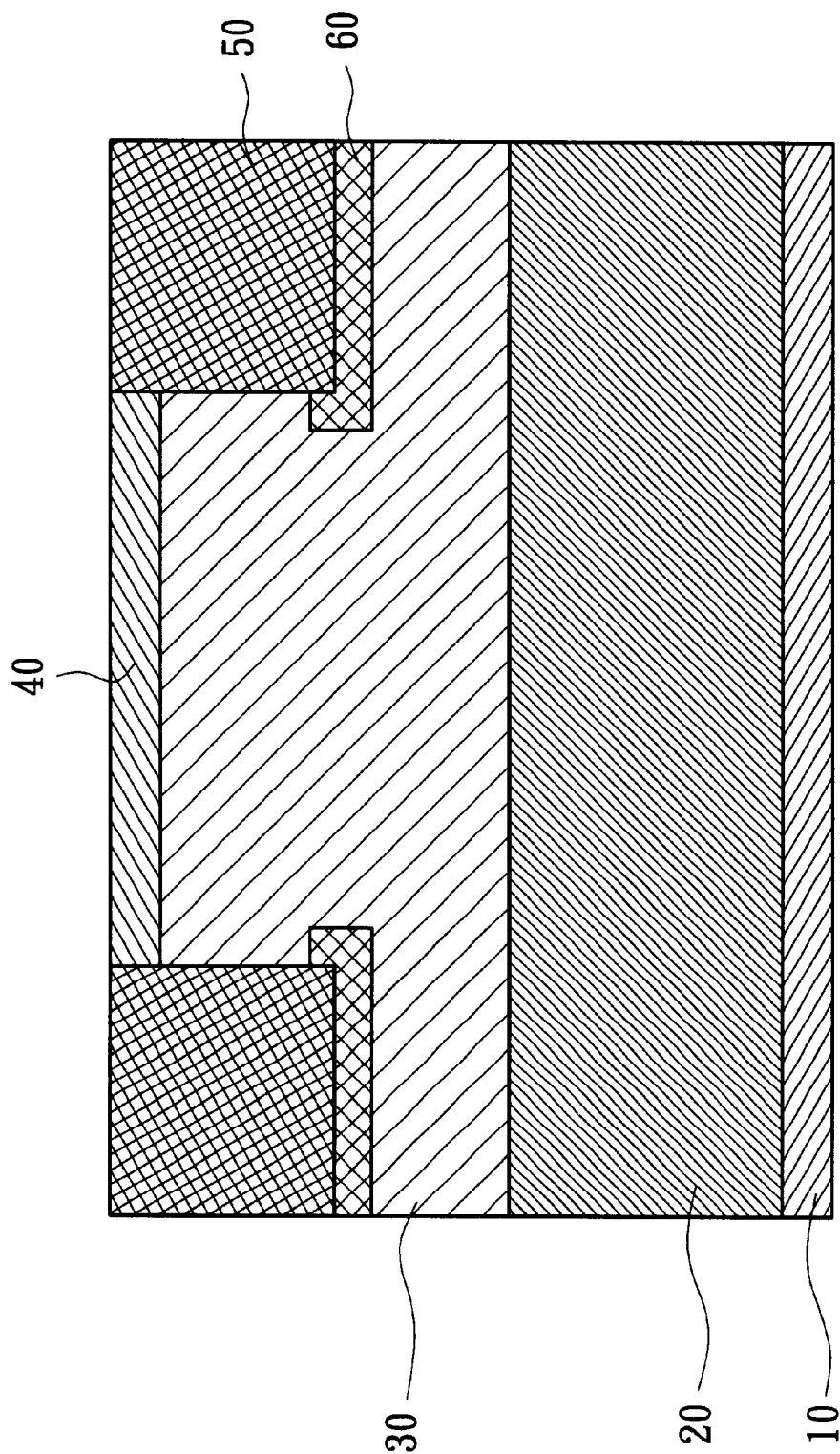
FIG. 3 illustrates a cross sectional view of the SiC dual metal trench Schottly diode in the first embodiment.

Referring to FIG. 3, which illustrates a cross sectional view of the SiC dual metal trench Schottly diode in the first embodiment.

The invention is an SiC dual metal trench Schottky diode which includes ohmic contact metal 10, substrate 20, an epitaxial layer 30, Schottky contact metal 40, a trench layer 50 and implant 60.

The material selected for the ohmic contact metal 10 is gold, silver or Platinum.

The substrate 20 produced from N+ type SiC (Silicon Carbide) is located on the top of ohmic contact metal.

The epitaxial layer 30 produced from N− type SiC is located on the top of the substrate.

The Schottky contact metal 40 produced from the first metal is located on the top of the epitaxial layer 30. A Schottky junction is formed between the Schottky contact metal 40 and the epitaxial layer 30.

The trench layer 50 is produced by etching the Schottky contact metal 40 and the epitaxial layer 30, then filling a second metal that is different from the first metal into the opening produced by the etching process. A Schottky junction is formed between the trench layer 50 and the epitaxial layer 30.

The implant 60 is located at the bottom of the trench layer 50, between the epitaxial layer 30 and the trench layer 50. The implant 60 is produced from P-type material such as boron or aluminum. The thickness of the implant 60 is about 1 to 10000 angstrom.

Figure 4:
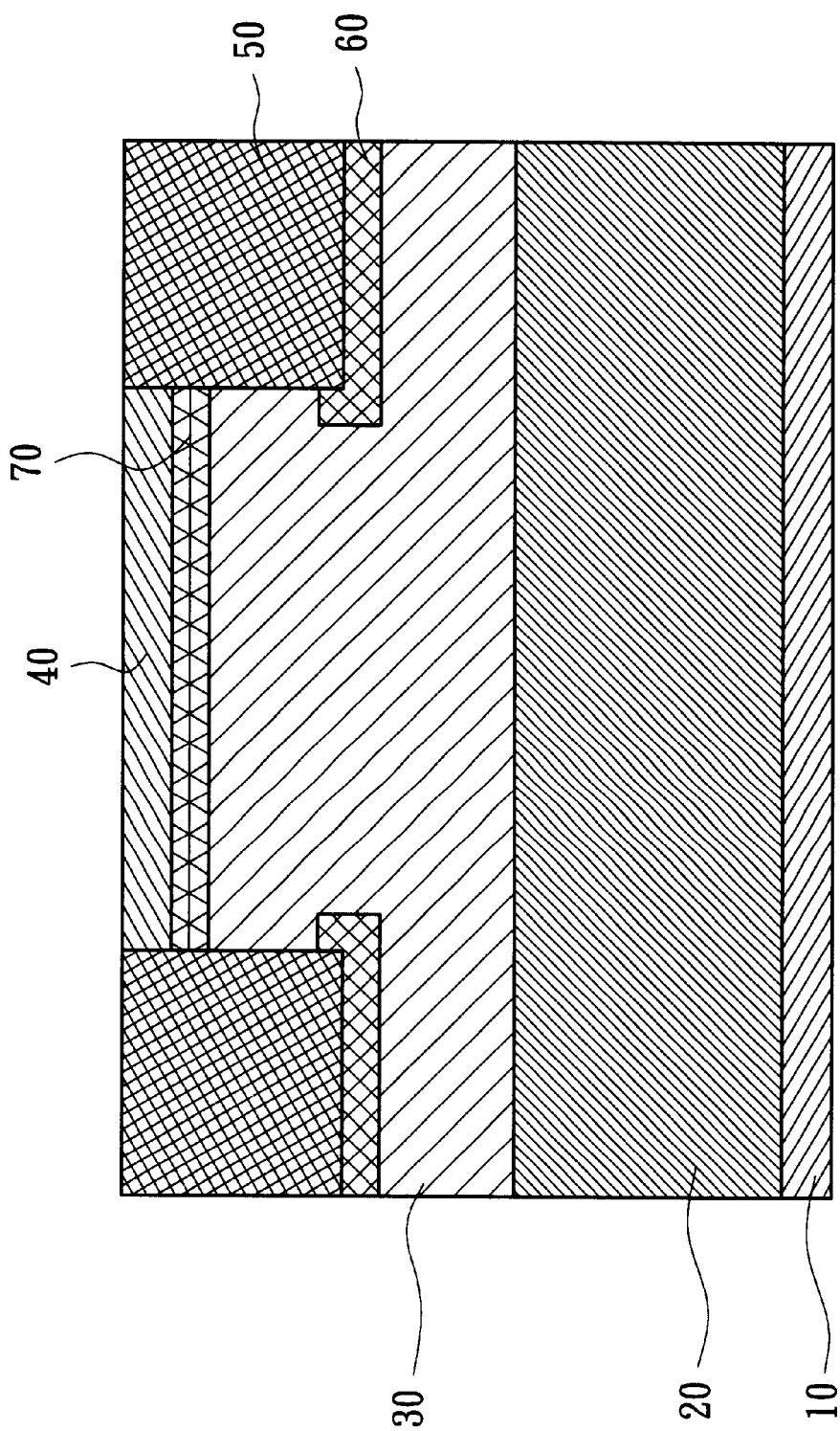
FIG. 4 illustrates a cross sectional view of the SiC dual metal trench Schottly diode in the second embodiment.

Referring to FIG. 4, which illustrates a cross sectional view of the SiC dual metal trench Schottly diode in the second embodiment.

The invention is an SiC dual metal trench Schottky diode which includes ohmic contact metal 10, substrate 20, an epitaxial layer 30, Schottky contact metal 40, a trench layer 50, implant 60, and voltage reducing layer 70.

The difference between the first embodiment and the second embodiment is only the voltage reducing layer 70 between the ohmic contact metal 10 and the epitaxial layer 30. The voltage reducing layer 70 is made from N-type impurity for reducing the Schottky barrier between the ohmic contact metal 10 and the epitaxial layer 30.

The voltage reducing layer 70 is formed by nitrogen and its thickness is about 1 to 10000 angstrom.

Figure 5:
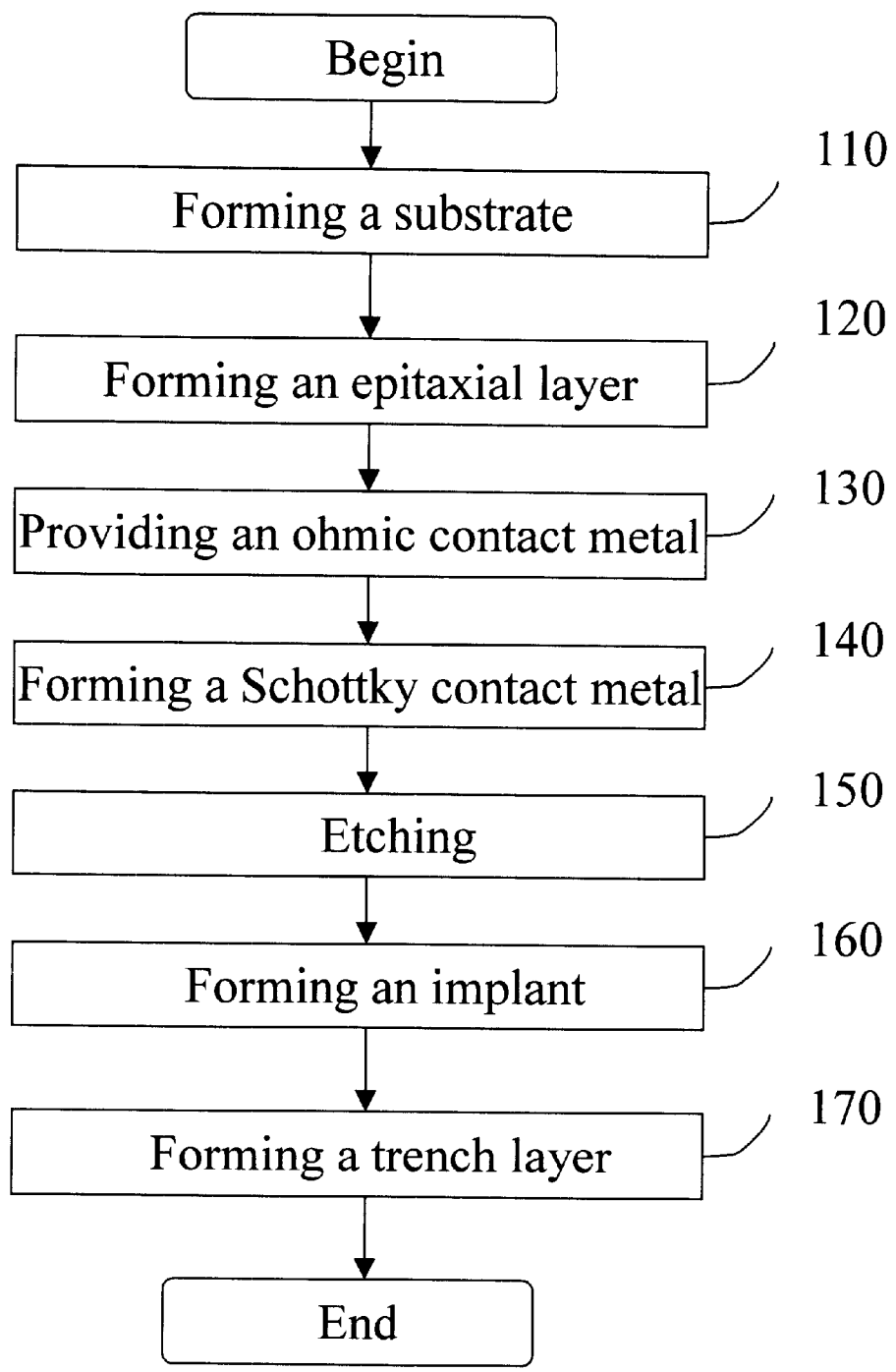
FIG. 5 is a flow chart of the first embodiment for manufacturing the SiC dual metal trench Schottly diode.

Referring to FIG. 5, which is a flow chart of the first embodiment for manufacturing the SiC dual metal trench Schottly diode.

The manufacturing method of the SiC dual metal trench Schottly diode in the first embodiment includes the following steps: forming a substrate 110, forming an epitaxial layer 120, providing an ohmic contact metal 130, forming a Schottky contact metal 140, etching 150, forming an implant 160, forming a trench layer 170.

The step for forming the substrate 110 involves using N+ type SiC as a substrate.

The step of forming an epitaxial layer 120 involves forming an epitaxial layer made from N− type SiC on the top of the substrate.

The step of providing an ohmic contact metal 130 involves providing an ohmic contact metal below the substrate.

The step of forming a Schottky contact metal 140 involves using the first metal to form a Schottky contact metal above the epitaxial layer and thus forming a Schottky junction between the ohmic contact metal and the epitaxial layer.

The step of etching 150 involves etching and then removing part of the epitaxial layer and the Schottky contact metal to form two openings.

The step of forming an implant 160 involves doping P-type impurity into the bottom of the two openings.

The step of forming the trench layer 170 involves filling a second metal into the openings to form two trench layers. A Schottky junction is formed between the trench layer and the epitaxial layer.

Figure 6:
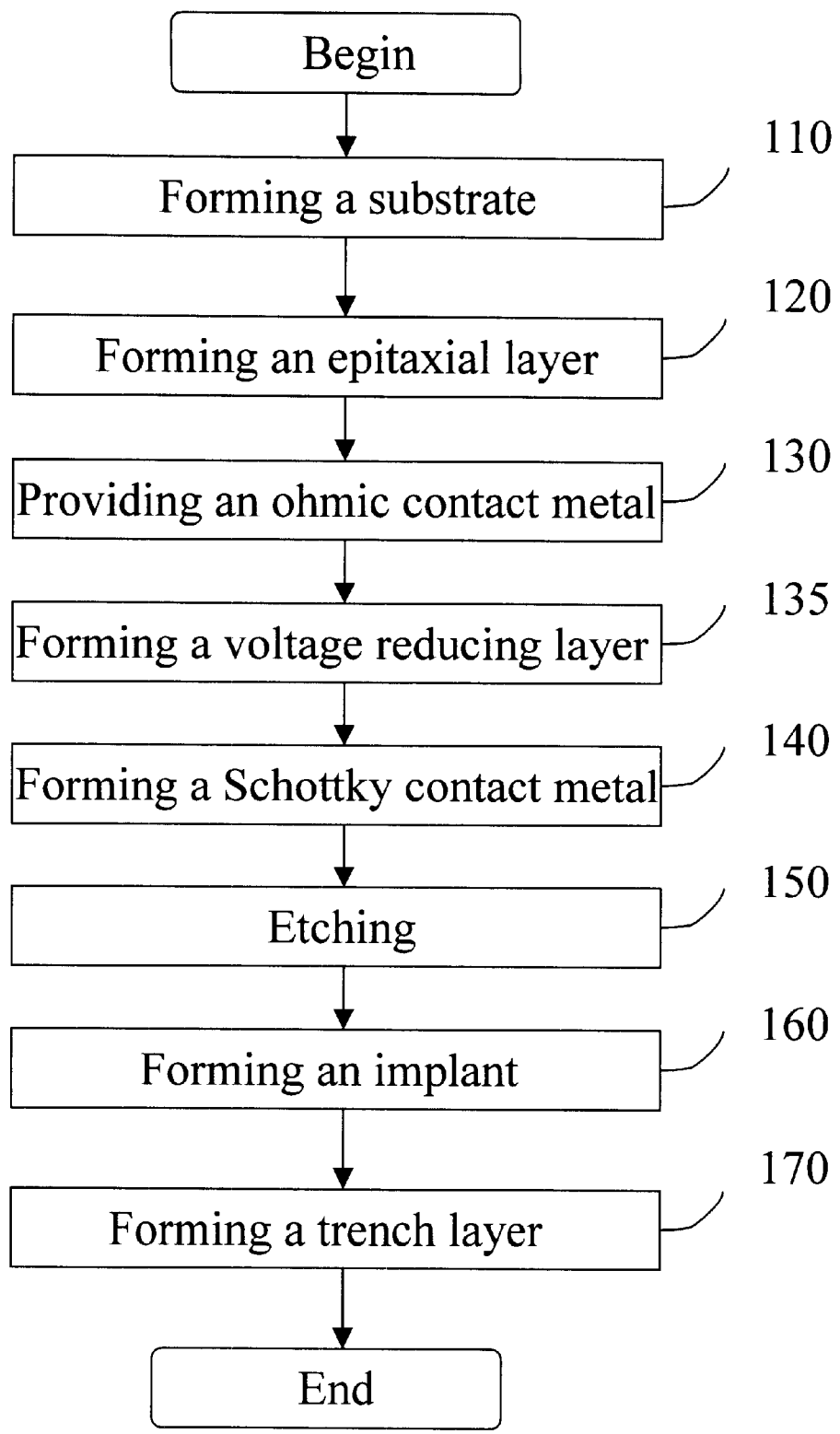
FIG. 6 is a flow chart of the second embodiment for manufacturing the SiC dual metal trench Schottly diode.

FIG. 6 is a flow chart of the second embodiment for manufacturing the SiC dual metal trench Schottly diode.

The manufacturing method of the SiC dual metal trench Schottly diode in the first embodiment includes the following steps: forming a substrate 110, forming an epitaxial layer 120, providing an ohmic contact metal 130, forming a voltage reducing layer 135, forming a Schottky contact metal 140, etching 150, forming an implant 160, forming a trench layer 170.

The difference between the first embodiment and the second embodiment is only forming the voltage reducing layer 135 between the Schottky contact metal and the epitaxial layer. The voltage reducing layer is made from N-type impurity for reducing the Schottky barrier between the ohmic contact metal and the epitaxial layer so the forward voltage required for current to flow through is reduced.

The voltage reducing layer is formed by nitrogen and its thickness is about 1 to 10000 angstrom.

In the invention, P-type impurity is doped into the bottom of the trench layer of the dual metal trench Schottky diode to eliminate leakage current or avalanche breakdown in the corner of the trench layer in order to increase the concentration of the epitaxial layer and obtain low resistance under high breakdown voltage. N-type impurity is doped into the region between the Schottky contact metal and the epitaxial layer to adjust the Schottky barrier and thus reduce forward voltage required for current to flow through.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An SiC dual metal trench Schottky diode, comprising:
   an ohmic contact metal,
   a substrate made from N+ silicon carbide located on the top of said ohmic contract metal,
   an epitaxial layer produced from N− type SiC located on the top of said substrate,
   a Schottky contact metal produced from a first metal located on the top of said epitaxial layer, a Schottky junction being produced between said Schottky contact metal and said epitaxial layer,
   a trench layer produced by etching said Schottky contact metal and said epitaxial layer and then filling a second metal to the opening produced by the etching process, said Schottky junction being produced between said trench and said epitaxial layer,
   an implant formed by P-type impurity located at the bottom of said trench layer, and
   a voltage reducing layer made from N-type impurity located between said ohmic contact metal and said epitaxial layer, for the purpose of reducing Schottky barrier generated between said Schottky contact metal and said epitaxial layer.

2. The SiC dual metal trench Schottky diode of claim 1, wherein the material of said implant contains boron.

3. The SiC dual metal trench Schottky diode of claim 1, wherein the material of said implant contains aluminum.

4. The SiC dual metal trench Schottky diode of claim 1, wherein the thickness of said implant is about 1 to 10000 angstroms.

5. The SiC dual metal trench Schottky diode of claim 1, wherein said voltage reducing layer is made from nitrogen.

6. The SiC dual metal trench Schottky diode of claim 1, wherein the thickness of said voltage is about 1 to 10000 angstroms.

7. A manufacturing method for an SiC dual metal trench Schottky diode, comprising:

forming a substrate, said substrate being formed from N+ silicon carbide, forming an epitaxial layer, said epitaxial layer being produced from N– type SiC and located on the top of said substrate, providing an ohmic contact metal, said ohmic contact metal being provided on the bottom of said substrate, forming a Schottky junction, a first metal being used to form a Schottky contact metal on the top of said epitaxial layer, said Schottky junction, being formed between said Schottky contact metal and said epitaxial layer, etching, a partial portion of said epitaxial layer and said Schottky contact metal are etched and then removed to form an opening, forming an implant, a P-type impurity being doped into the bottom of said opening, forming a trench layer, a second metal being filled into the opening to form two trench layers, said Schottky junction being formed between said trench layers and said epitaxial layer, and forming a voltage reducing layer, said voltage reducing layer being made from an N-type impurity located between said Schottky contact metal and said epitaxial layer, for the purpose of reducing Schottky barrier generated between said ohmic contact metal and said epitaxial layer.

8. The manufacturing method for the SiC dual metal trench Schottky diode of claim 7, wherein the material of said implant contains boron.

9. The manufacturing method for the SiC dual metal trench Schottky diode of claim 7, wherein the material of said implant contains aluminum.

10. The manufacturing method for the SiC dual metal trench Schottky diode of claim 7, wherein the thickness of said implant is about 1 to 10000 angstroms.

11. The manufacturing method for the SiC dual metal trench Schottky diode of claim 7, wherein said voltage reducing layer is made from nitrogen.

12. The manufacturing method for the SiC dual metal trench Schottky diode of claim 7, wherein the thickness of said voltage is about 1 to 10000 angstroms.

* * * * *